United States Patent
Zheng et al.

(10) Patent No.: US 9,470,942 B2
(45) Date of Patent: Oct. 18, 2016

(54) PIXEL STRUCTURE COMPRISING A BLACK MATRIX HAVING FIRST AND SECOND PORTIONS WHEREIN THE SECOND PORTION IS IN EXACT ALIGNMENT WITH AN EDGE OF A PIXEL ELECTRODE AND LIQUID CRYSTAL DISPLAY PANEL HAVING SAME

(71) Applicant: Shenzhen China Star Optoelectronics Technology Co., Ltd., Shenzhen, Guangdong (CN)

(72) Inventors: Hua Zheng, Guangdong (CN); Jinbo Guo, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 240 days.

(21) Appl. No.: 14/349,393

(22) PCT Filed: Jan. 24, 2014

(86) PCT No.: PCT/CN2014/071342
§ 371 (c)(1),
(2) Date: Apr. 3, 2014

(87) PCT Pub. No.: WO2015/096265
PCT Pub. Date: Jul. 2, 2015

(65) Prior Publication Data
US 2015/0185568 A1  Jul. 2, 2015

(30) Foreign Application Priority Data

Dec. 27, 2013 (CN) .......................... 2013 1 0733538

(51) Int. Cl.
*G02F 1/1335* (2006.01)
*G02F 1/1362* (2006.01)
(Continued)

(52) U.S. Cl.
CPC ....... *G02F 1/136209* (2013.01); *G02F 1/1368* (2013.01); *G02F 1/133512* (2013.01);
(Continued)

(58) Field of Classification Search
CPC ............. G02F 1/136209; G02F 2001/136222; G02F 2201/40
USPC ......................................... 349/110
See application file for complete search history.

(56) References Cited

U.S. PATENT DOCUMENTS

2001/0046003 A1* 11/2001 Song ............... G02F 1/1309 349/43
2004/0119917 A1* 6/2004 Lim ................ G02F 1/133512 349/110
2004/0135939 A1* 7/2004 Luo ................ G02F 1/136209 349/110

(Continued)

FOREIGN PATENT DOCUMENTS

| CN | 101988998 A |   | 3/2011 |
| CN | 101988998 A | * | 3/2011 |
| CN | 202330954 U |   | 7/2012 |

*Primary Examiner* — Paul Lee
(74) *Attorney, Agent, or Firm* — Andrew C. Cheng (57) ABSTRACT

The present invention provides a pixel structure and a liquid crystal panel having the pixel structure. The pixel structure includes a plurality of sub pixel units, a plurality of data lines respectively supplying data signals to the sub pixel units, and a black matrix (8) arranged to correspond to the data lines and the sub pixel units. The plurality of sub pixel units is arranged in multiple columns of which two adjacent columns of the sub pixel units are sequentially grouped and defined as a sub-pixel-unit-column pair (20). Each of the sub-pixel-unit-column pairs (20) shows mirror symmetry. The data lines are respectively arranged in the sub-pixel-unit-column pairs (20). The black matrix (8) includes first portions (82) located above the data lines, second portions (84) each located between two adjacent ones of the first portions (82), and third portions (86) respectively and perpendicularly connected to opposite ends of the first portions (82) and the second portions (84). The first portions (82) have a width that is greater than the width of the second portions (84).

14 Claims, 7 Drawing Sheets

(51) Int. Cl.
  *G02F 1/1368* (2006.01)
  *H01L 27/12* (2006.01)
(52) U.S. Cl.
  CPC ....... *G02F1/136286* (2013.01); *H01L 27/124* (2013.01); *G02F 2001/136222* (2013.01); *G02F 2201/40* (2013.01)

(56) References Cited

U.S. PATENT DOCUMENTS

2005/0219436 A1* 10/2005 Kwon ............... G02F 1/136209 349/44
2010/0079695 A1* 4/2010 Um ................... G02F 1/136213 349/43

\* cited by examiner

PIXEL STRUCTURE COMPRISING A BLACK MATRIX HAVING FIRST AND SECOND PORTIONS WHEREIN THE SECOND PORTION IS IN EXACT ALIGNMENT WITH AN EDGE OF A PIXEL ELECTRODE AND LIQUID CRYSTAL DISPLAY PANEL HAVING SAME

BACKGROUND OF THE INVENTION

1. Field of the Invention

The present invention relates to the field of flat panel displaying, and in particular to a pixel structure that eliminates vertical crosstalk and a liquid crystal display panel having the pixel structure.

2. The Related Arts

Liquid crystal displays (LCDs) have various advantages, including thin device body, saving power, and being free of radiation, and are thus widely used. Most of the liquid crystal displays that are currently available in the market are backlighting liquid crystal displays, which comprise an enclosure, a liquid crystal panel arranged in the enclosure, and a backlight module mounted in the enclosure. The principle of operation of the liquid crystal panel is that liquid crystal molecules are arranged between two parallel glass substrates and electricity is applied to control the liquid crystal molecules to change direction in order to refract light emitting from the backlight module to pass through a pixel structure formed on the glass substrates to generate a color image.

Since an upper substrate (the array substrate) and a lower substrate (the color filter (CF) substrate) of a liquid crystal panel are bonded together by means of circumferentially-arranged enclosing resin, it is very likely that relative positional shift may occur in a display zone. If the relative positional shift may make a black matrix (BM) formed on the upper substrate not effectively shielding light leaking areas around data lines on the lower substrate, a situation of poor displaying where light leaking occurs in a dark image located in a vertical direction of a bright image, which is referred to as vertical crosstalk (V-crosstalk).

Figure 1:
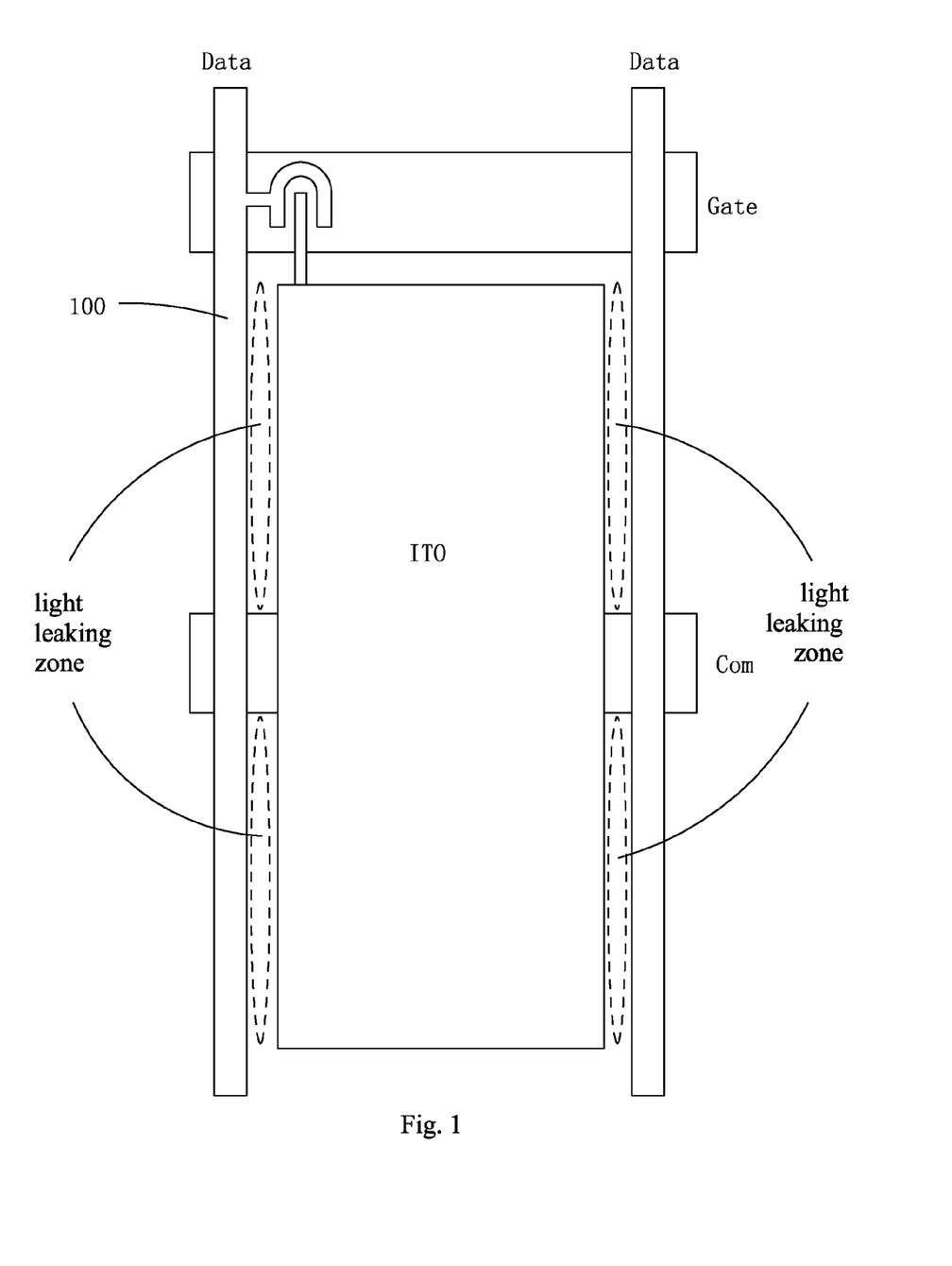
FIG. 1 is a schematic plan view showing a single ideal pixel structure.
Figure 2:
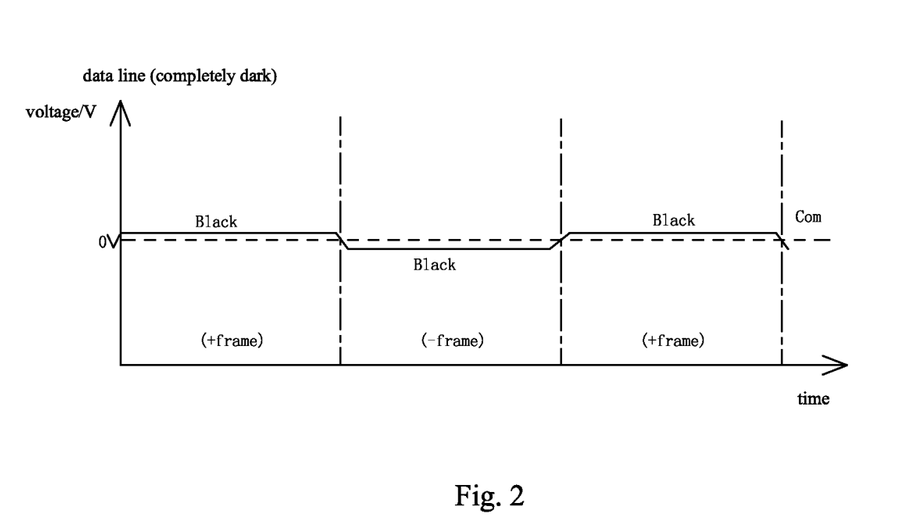
FIG. 2 is a plot of the voltage curve of a data line in a completely dark condition.
Figure 3:
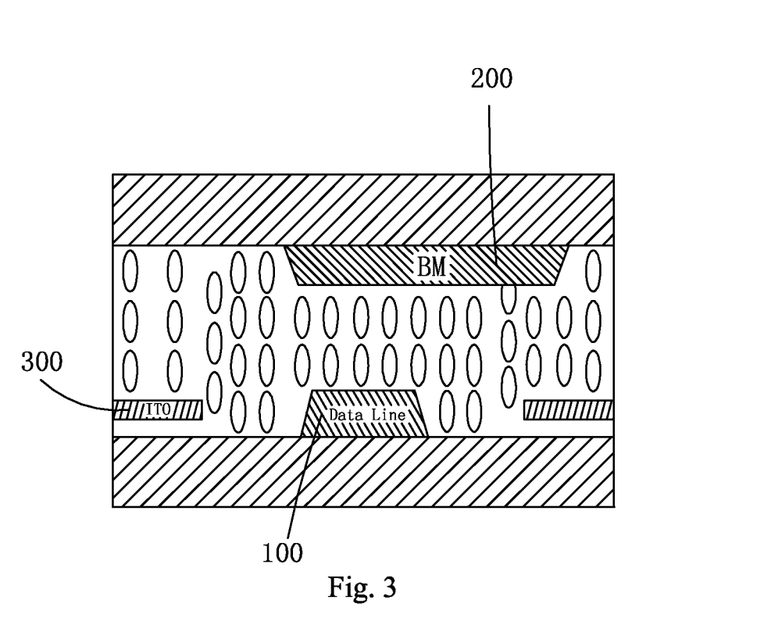
FIG. 3 is a schematic view showing a liquid crystal panel corresponding to the voltage of FIG. 2.
Figure 4:
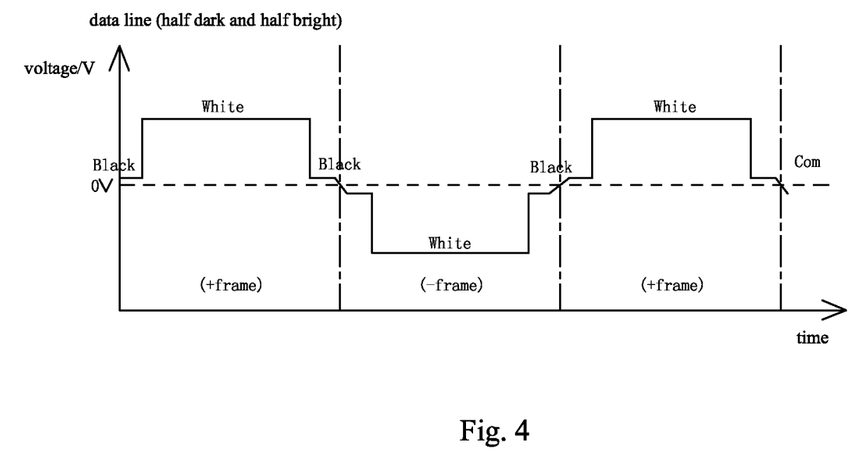
FIG. 4 is a plot of the voltage curve of a data line in half-dark and half bright displaying.
Figure 5:
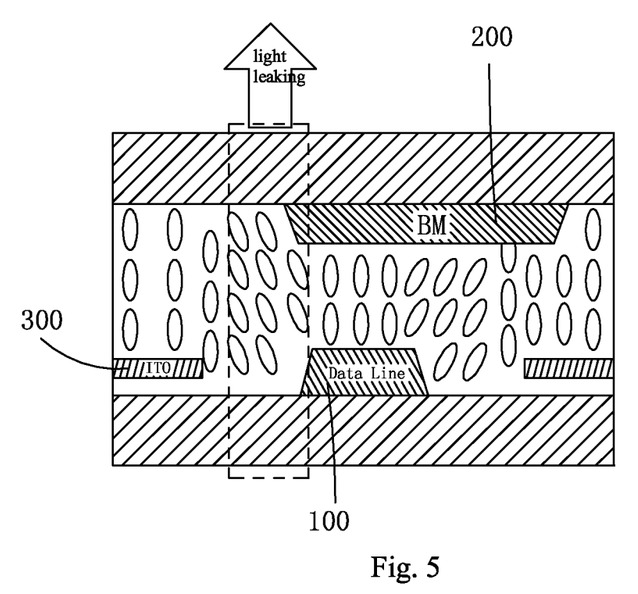
FIG. 5 is a schematic view showing a liquid crystal panel corresponding to the voltage of FIG. 4.

Positional shift between a lower substrate and an upper substrate of a liquid crystal panel resulting in vertical crosstalk is demonstrated in FIGS. 1-5, in which FIG. 1 is a schematic view showing the structure of a pixel structure manufactured with a five-mask process. When a signal applied to a data line is kept at a low biasing voltage (as shown in FIG. 2), no rotation of liquid crystal will occur on opposite sides thereof (see FIG. 3) and thus no light leaking zone is induced. If the signal applied to the data line 100 is a high biasing voltage at one time and is a low biasing voltage at another time (as shown in FIG. 4), then in the period when the signal of the data line 100 is the high biasing voltage, rotation of liquid crystal will occur on opposite sides of the entirety of the data line, thereby resulting in the formation of light leaking area (as shown in FIG. 5).

Figure 6:
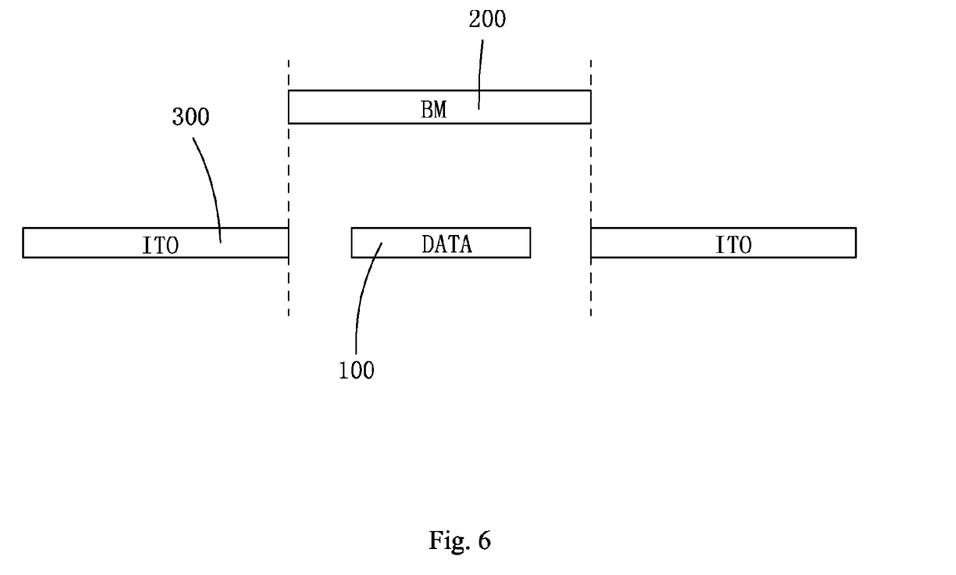
FIG. 6 is a schematic cross-sectional view of a pixel having an ideal structure.
Figure 7:
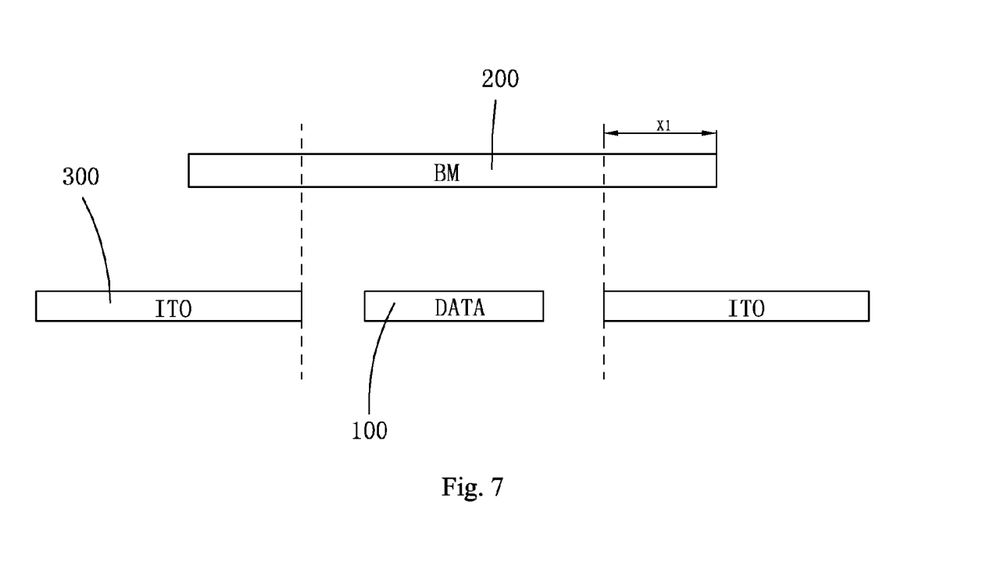
FIG. 7 is a schematic cross-sectional view of a conventional pixel structure.
Figure 8:
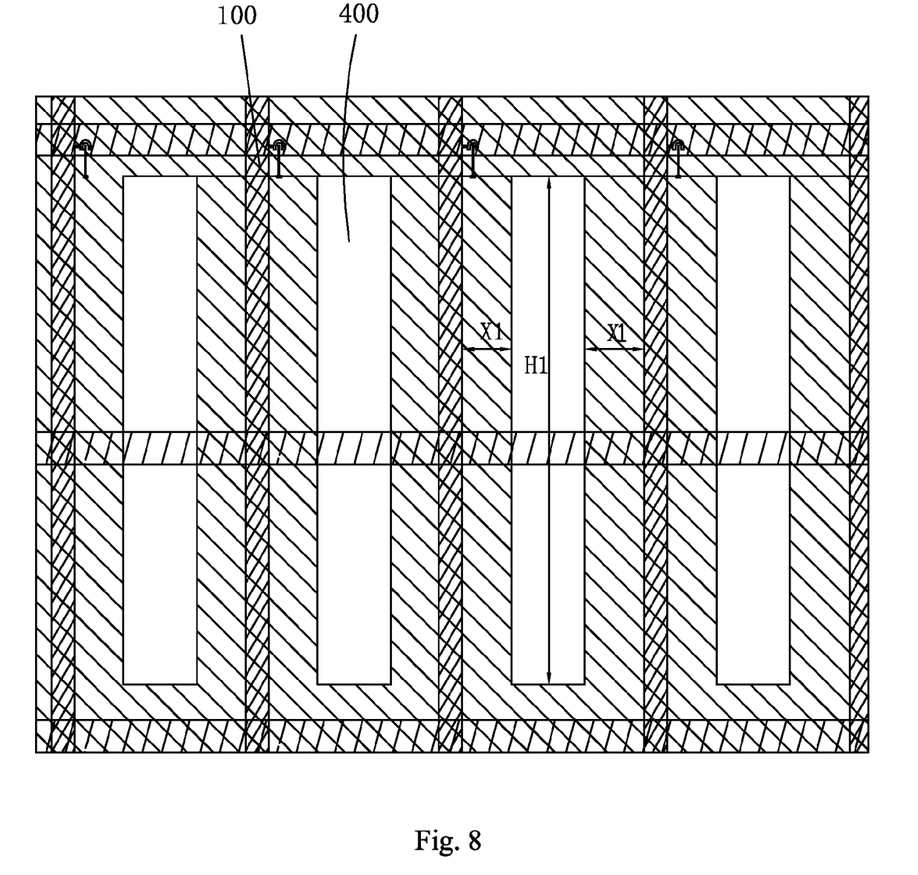
FIG. 8 is a schematic cross-sectional view of a conventional pixel structure.

Ideally, to maximize the aperture ratio of a pixel, a designer would wish to have the black matrix 200 can provide shielding that just covers edges of the aperture area of a pixel electrode (ITO) 300 (see FIG. 6). However, to prevent vertical crosstalk, a common solution is to widen the black matrix 200 to have the black matrix 200 shielding a further distance X1 into the aperture area (see FIG. 7). The value of X1 is determined by the positional shift between the upper and lower substrates, while the positional shift is determined by the actual conditions of the panel and is generally between 0-30 µm. The greater the positional shift is, the greater the chance of causing vertical crosstalk will be. Generally, the value of X1 is set between 2 µm-20 µm. The greater the value of X1 is, the greater the loss of the aperture ratio will be. However, for a regular pixel structure (as shown in FIG. 8), since an aperture area 400 is provided on both the left side and the right side thereof with data lines 100, the loss of the area of the aperture area 400 of each pixel is equal to 2X1*H1 (where H1 is an effective height of the aperture area 400) and this causes an increased loss of the aperture ratio.

SUMMARY OF THE INVENTION

An object of the present invention is to provide a pixel structure, which can effectively increase aperture ratio under the condition that vertical crosstalk is effectively prevented.

Another object of the present invention is to provide a liquid crystal panel, which has a large aperture ratio and excellent displaying performance.

To achieve the objects, the present invention provides a pixel structure, which comprises: a plurality of sub pixel units, a plurality of data lines respectively supplying data signals to the sub pixel units, and a black matrix arranged to correspond to the data lines and the sub pixel units. The plurality of sub pixel units is arranged in multiple columns, of which two adjacent columns of the sub pixel units are sequentially grouped and defined as a sub-pixel-unit-column pair. Each of the sub-pixel-unit-column pairs shows mirror symmetry. The data lines are respectively arranged in the sub-pixel-unit-column pairs. The black matrix comprises first portions located above the data lines, second portions each located between two adjacent ones of the first portions, and third portions respectively and perpendicularly connected to opposite ends of the first portions and the second portions. The first portions have a width that is greater than a width of the second portions.

Two adjacent ones of the sub-pixel-unit-column pairs comprise sub pixel units that are located on a same row and include a first sub pixel unit, a second sub pixel unit, a third sub pixel unit, and a fourth sub pixel unit that are sequentially adjacent to each other, in which the data lines include a first data line that supplies a data signal to the first sub pixel unit, a second data line that supplies a data signal to the second sub pixel unit, a third data line that supplies a data signal to the third sub pixel unit, and a fourth data line that supplies a the data signal to the fourth sub pixel unit, and the first data line is arranged by the side of the first sub pixel unit that is close to the second sub pixel unit; the second data line is arranged by the side of the second sub pixel unit that is close to the first sub pixel unit; the third data line is arranged by the side of the third sub pixel unit that is distant from the second sub pixel unit; and the fourth data is arranged by the side of the fourth sub pixel unit that is close to the third sub pixel unit.

The first portion of the black matrix is located above the first and second sub pixel units and partly covers the first and second sub pixel units and the second portion is located above the space between the second and third sub pixel units and has a width that is equal to a spacing distance between the second sub pixel unit and the third sub pixel unit.

A width of a portion of the first portion that covers the first sub pixel unit is identical to a width of a portion thereof covering the second sub pixel unit.

The width of the portion of the first portion that covers the first sub pixel unit and the width of the portion of the first portion that covers the second sub pixel unit are both 2 µm-20 µm.

The present invention also provides a pixel structure, which comprises: a plurality of sub pixel units, a plurality of data lines respectively supplying data signals to the sub pixel units, and a black matrix arranged to correspond to the data lines and the sub pixel units, the plurality of sub pixel units being arranged in multiple columns, of which two adjacent columns of the sub pixel units are sequentially grouped and defined as a sub-pixel-unit-column pair, each of the sub-pixel-unit-column pairs showing mirror symmetry, the data lines being respectively arranged in the sub-pixel-unit-column pairs, the black matrix comprising first portions located above the data lines, second portions each located between two adjacent ones of the first portions, and third portions respectively and perpendicularly connected to opposite ends of the first portions and the second portions, the first portions having a width that is greater than a width of the second portions;

wherein two adjacent ones of the sub-pixel-unit-column pairs comprise sub pixel units that are located on a same row and include a first sub pixel unit, a second sub pixel unit, a third sub pixel unit, and a fourth sub pixel unit that are sequentially adjacent to each other, in which the data lines include a first data line that supplies a data signal to the first sub pixel unit, a second data line that supplies a data signal to the second sub pixel unit, a third data line that supplies a data signal to the third sub pixel unit, and a fourth data line that supplies a the data signal to the fourth sub pixel unit, and the first data line is arranged by the side of the first sub pixel unit that is close to the second sub pixel unit; the second data line is arranged by the side of the second sub pixel unit that is close to the first sub pixel unit; the third data line is arranged by the side of the third sub pixel unit that is distant from the second sub pixel unit; and the fourth data is arranged by the side of the fourth sub pixel unit that is close to the third sub pixel unit.

The first portion of the black matrix is located above the first and second sub pixel units and partly covers the first and second sub pixel units and the second portion is located above the space between the second and third sub pixel units and has a width that is equal to a spacing distance between the second sub pixel unit and the third sub pixel unit.

A width of a portion of the first portion that covers the first sub pixel unit is identical to a width of a portion thereof covering the second sub pixel unit.

The width of the portion of the first portion that covers the first sub pixel unit and the width of the portion of the first portion that covers the second sub pixel unit are both 2 µm-20 µm.

The present invention further provides a liquid crystal panel, which comprises a TFT (Thin-Film Transistor) substrate, a CF (Color Filter) substrate opposite to and laminated to the TFT substrate, and a liquid crystal layer arranged between the TFT substrate and the CF substrate. The TFT substrate comprises a plurality of sub pixel units and a plurality of data lines respectively supplying data signals to the sub pixel units formed thereon. The CF substrate comprises a black matrix formed thereon to correspond to the data lines and the sub pixel units. The plurality of sub pixel units is arranged in multiple columns, of which two adjacent columns of the sub pixel units are sequentially grouped and defined as a sub-pixel-unit-column pair. Each of the sub-pixel-unit-column pairs shows mirror symmetry. The data lines are respectively arranged in the sub-pixel-unit-column pairs. The black matrix comprises first portions located above the data lines, second portions each located between two adjacent ones of the first portions, and third portions respectively and perpendicularly connected to opposite ends of the first portions and the second portions. The first portions have a width that is greater than a width of the second portions.

Two adjacent ones of the sub-pixel-unit-column pairs comprise sub pixel units that are located on a same row and include a first sub pixel unit, a second sub pixel unit, a third sub pixel unit, and a fourth sub pixel unit that are sequentially adjacent to each other, in which the data lines include a first data line that supplies a data signal to the first sub pixel unit, a second data line that supplies a data signal to the second sub pixel unit, a third data line that supplies a data signal to the third sub pixel unit, and a fourth data line that supplies a the data signal to the fourth sub pixel unit, and the first data line is arranged by the side of the first sub pixel unit that is close to the second sub pixel unit; the second data line is arranged by the side of the second sub pixel unit that is close to the first sub pixel unit; the third data line is arranged by the side of the third sub pixel unit that is distant from the second sub pixel unit; and the fourth data is arranged by the side of the fourth sub pixel unit that is close to the third sub pixel unit.

The first portion of the black matrix is located above the first and second sub pixel units and partly covers the first and second sub pixel units and the second portion is located above the space between the second and third sub pixel units and has a width that is equal to a spacing distance between the second sub pixel unit and the third sub pixel unit.

A width of a portion of the first portion that covers the first sub pixel unit is identical to a width of a portion thereof covering the second sub pixel unit.

The width of the portion of the first portion that covers the first sub pixel unit and the width of the portion of the first portion that covers the second sub pixel unit are both 2 µm-20 µm.

The efficacy of the present invention is that the present invention provides a pixel structure and a liquid crystal panel having the pixel structure, in which two data lines are arranged in each sub-pixel-unit-column pair so that no data line is arranged between two adjacent sub-pixel-unit-column pair whereby a widened portion of back matrix can only be provided at the location where the data lines are arranged to effectively prevent a vertical crosstalk phenomenon caused by relative positional shift between the TFT substrate and the CF substrate and a narrowed portion of the black material can be arranged at the location where no data line is present to effectively increase the aperture ratio and thus enhancing displaying performance.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 9:
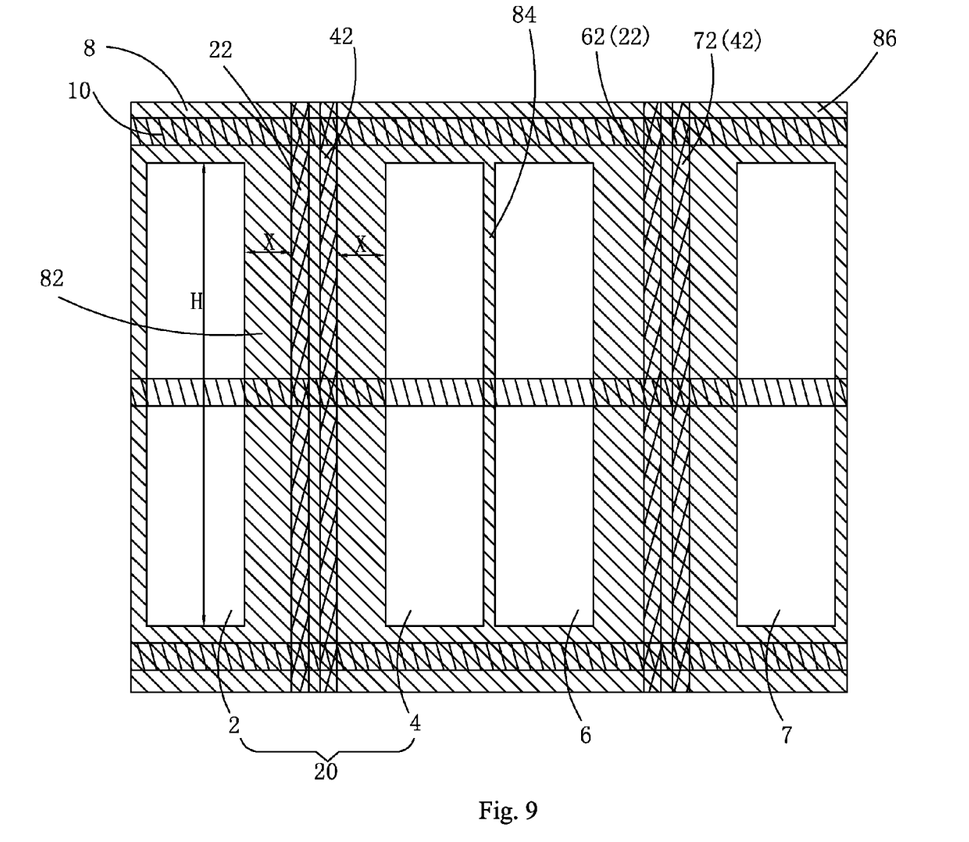
FIG. 9 is a schematic plan view of a pixel structure according to the present invention.

Referring to FIG. 9, the present invention provides a pixel structure, which comprises: a plurality of sub pixel units, a plurality of data lines respectively supplying data signals to the sub pixel units, and a black matrix 8 arranged to correspond to the data lines and the sub pixel units. The plurality of sub pixel units is arranged in multiple columns of which two adjacent columns of the sub pixel units are sequentially grouped and defined as a sub-pixel-unit-column pair 20. Each of the sub-pixel-unit-column pairs 20 shows mirror symmetry. The data lines are respectively arranged in the sub-pixel-unit-column pairs 20, so that no data line is present between two adjacent ones of the sub-pixel-unit-column pairs 20. The black matrix 8 comprises first portions 82 located above the data lines, second portions 84 each located between two adjacent ones of the first portions 82, and third portions 86 respectively and perpendicularly connected to opposite ends of the first portions 82 and the second portions 84. The second portions 84 have a width that is equal to a spacing distance of a gap between two adjacent ones of the sub pixel units located under the second portion 84. The first portions 82 have a width that is greater than the width of the second portions 84 in order to effectively increase aperture ratio under a condition of effectively preventing vertical crosstalk.

It is noted that the pixel structure further comprises gate lines 10 that are arranged perpendicular to the data lines. The third portions 86 of the black matrix 8 are arranged above the gate lines 10. The first portions 82, the second portions 84, and the third portions 86 of the black matrix 8 cover edge areas of the sub pixel unit.

A detailed description will be given with four sub pixel units of two adjacent sub-pixel-unit-column pairs 20 that are located on the same row being taken as an example for illustration. The four sub pixel units include a first sub pixel unit 2, a second sub pixel unit 4, a third sub pixel unit 6, and a fourth sub pixel unit 7 that are sequentially adjacent to each other, in which the data lines include a first data line 22 that supplies a data signal to the first sub pixel unit 2, a second data line 42 that supplies a data signal to the second sub pixel unit 4, a third data line 62 that supplies a data signal to the third sub pixel unit 6, and a fourth data line 72 that supplies a the data signal to the fourth sub pixel unit 7. The first data line 22 is arranged by the side of the first sub pixel unit 2 that is close to the second sub pixel unit 4; the second data line 42 is arranged by the side of the second sub pixel unit 4 that is close to the first sub pixel unit 2; the third data line 62 is arranged by the side of the third sub pixel unit 6 that is distant from the second sub pixel unit 4; and the fourth data line 72 is arranged by the side of the fourth sub pixel unit 7 that is close to the third sub pixel unit 6. This makes the data lines all located the first and second sub pixel units 2, 4 with no data line present between the second and third sub pixel units 4, 6, whereby crosstalk can be prevented by only widening the portion of the black matrix 8 located above the space between the first and second sub pixel units 2, 4 without the need to widen the portion of the black matrix 8 located above the space between the second and third sub pixel units 4, 6, so that the black matrix 8 only needs to cover one side of the pixel unit and the aperture ratio of the pixel structure can be increased.

Figure 10:
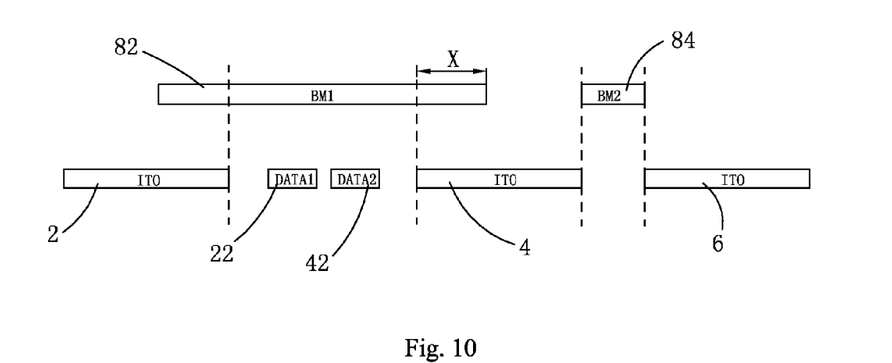
FIG. 10 is a schematic cross-sectional view of the pixel structure according to the present invention.

Specifically, referring to FIG. 10, in the instant embodiment, the first portion 82 of the black matrix 8 is located above the first and second sub pixel units 2, 4 and partly covers the first and second sub pixel units 2, 4. The second portion 84 is located above the space between the second and third sub pixel units 4, 6 and has a width that is equal to the spacing distance between the second sub pixel unit 4 and the third sub pixel unit 6.

The width of a portion of the first portion 82 that covers the first sub pixel unit 2 is identical to the width of a portion thereof covering the second sub pixel unit 4, both being designated as X. In the instant embodiment, the width X of the portions of the first portion 82 that cover the first and second sub pixel units 2, 4 is 2 μm-20 μm. Assuming the height of an effective aperture ratio of a pixel unit is H, the area of the portion of a single pixel unit that is so covered is X*H, which is reduced by half as compared to the covered area 2X*H of a pixel unit in a conventional pixel structure, so that the aperture ratio of the pixel structure can be effectively increased.

Figure 11:
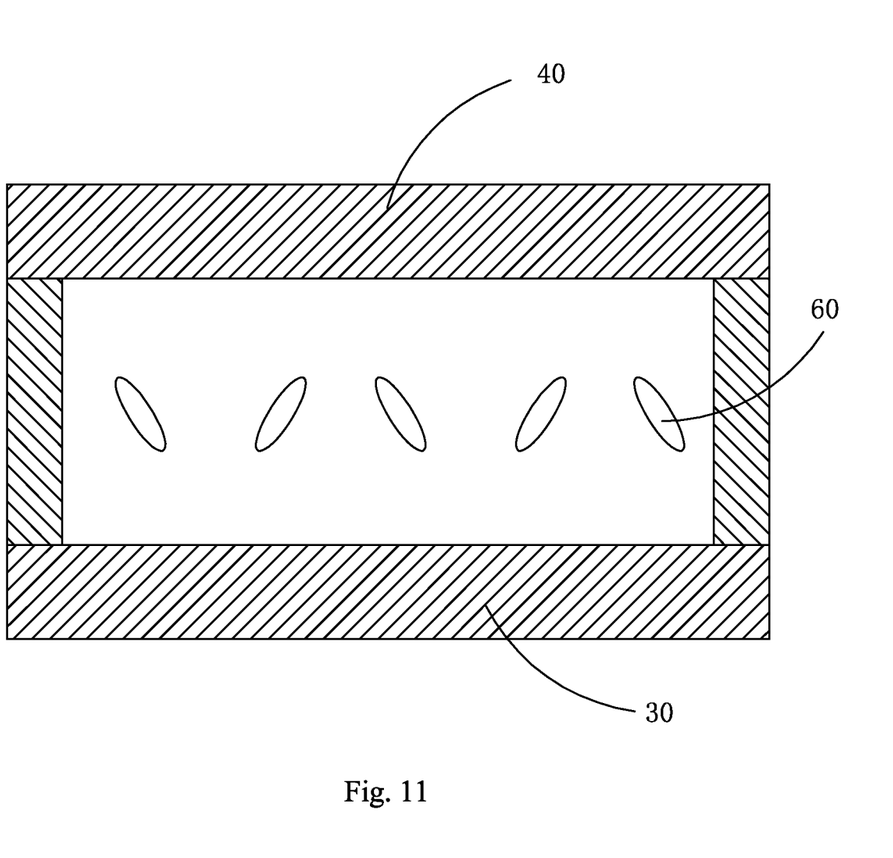
FIG. 11 is a schematic view showing the structure of a liquid crystal panel according to the present invention.

Referring to FIG. 11, with additional reference to FIGS. 9 and 10, the present invention also provides a liquid crystal panel, which comprises a TFT (Thin-Film Transistor) substrate 30, a CF (Color Filter) substrate 40 opposite to and laminated to the TFT substrate 30, and a liquid crystal layer 60 arranged between the TFT substrate 30 and the CF substrate 40. The TFT substrate 30 comprises a plurality of sub pixel units and a plurality of data lines respectively supplying data signals to the sub pixel units formed thereon. The CF substrate 40 comprises a black matrix 8 formed thereon to correspond to the data lines and the sub pixel units. The plurality of sub pixel units is arranged in multiple columns and two adjacent columns of the sub pixel units that are sequentially grouped and defined as a sub-pixel-unit-column pair 20. Each of the sub-pixel-unit-column pairs 20 shows mirror symmetry. The data lines are respectively arranged in the sub-pixel-unit-column pairs, so that no data line is present between two adjacent ones of the sub-pixel-unit-column pairs 20. The black matrix 8 comprises first portions 82 located above the data lines, second portions 84 each located between two adjacent ones of the first portions 82, and third portions 86 respectively and perpendicularly connected to opposite ends of the first portions 82 and the second portions 84. The second portions 84 have a width that is equal to a spacing distance of a gap between two adjacent ones of the sub pixel units located under the second portion 84. The first portions 82 have a width that is greater than the width of the second portions 84 in order to effectively increase aperture ratio under a condition of effectively preventing vertical crosstalk.

It is noted that the pixel structure further comprises gate lines 10 that are arranged perpendicular to the data lines. The third portions 86 of the black matrix 8 are arranged above the gate lines 10. The first portions 82, the second portions 84, and the third portions 86 of the black matrix 8 cover edge areas of the sub pixel unit.

A detailed description will be given with four sub pixel units of two adjacent sub-pixel-unit-column pairs 20 that are located on the same row being taken as an example for illustration. The four sub pixel units include a first sub pixel unit 2, a second sub pixel unit 4, a third sub pixel unit 6, and a fourth sub pixel unit 7 that are sequentially adjacent to each other, in which the data lines include a first data line 22 that supplies a data signal to the first sub pixel unit 2, a second data line 42 that supplies a data signal to the second sub pixel unit 4, a third data line 62 that supplies a data signal to the third sub pixel unit 6, and a fourth data line 72 that supplies a the data signal to the fourth sub pixel unit 7. The first data line 22 is arranged by the side of the first sub pixel unit 2 that is close to the second sub pixel unit 4; the second data line 42 is arranged by the side of the second sub pixel unit 4 that is close to the first sub pixel unit 2; the third data line 62 is arranged by the side of the third sub pixel unit 6 that is distant from the second sub pixel unit 4; and the fourth data line 72 is arranged by the side of the fourth sub pixel unit 7 that is close to the third sub pixel unit 6. This makes the data lines all located the first and second sub pixel units 2, 4 with no data line present between the second and third sub pixel units 4, 6, whereby crosstalk can be prevented by only widening the portion of the black matrix 8 located above the space between the first and second sub pixel units 2, 4 without the need to widen the portion of the black matrix 8 located above the space between the second and third sub pixel units 4, 6, so that the black matrix 8 only needs to cover one side of the pixel unit and the aperture ratio of the pixel structure can be increased.

Specifically, referring to FIG. 10, in the instant embodiment, the first portion 82 of the black matrix 8 is located above the first and second sub pixel units 2, 4 and partly covers the first and second sub pixel units 2, 4. The second portion 84 is located above the space between the second and third sub pixel units 4, 6 and has a width that is equal to the spacing distance between the second sub pixel unit 4 and the third sub pixel unit 6.

The width of a portion of the first portion 82 that covers the first sub pixel unit 2 is identical to the width of a portion thereof covering the second sub pixel unit 4, both being designated as X. In the instant embodiment, the width X of the portions of the first portion 82 that cover the first and second sub pixel units 2, 4 is 2 µm-20 µm. Assuming the height of an effective aperture ratio of a pixel unit is H, the area of the portion of a single pixel unit that is so covered is X*H, which is reduced by half as compared to the covered area 2X*H of a pixel unit in a conventional pixel structure, so that the aperture ratio of the pixel structure can be effectively increased.

In summary, the present invention provides a pixel structure and a liquid crystal panel having the pixel structure, in which two data lines are arranged in each sub-pixel-unit-column pair so that no data line is arranged between two adjacent sub-pixel-unit-column pair whereby a widened portion of back matrix can only be provided at the location where the data lines are arranged to effectively prevent a vertical crosstalk phenomenon caused by relative positional shift between the TFT substrate and the CF substrate and a narrowed portion of the black material can be arranged at the location where no data line is present to effectively increase the aperture ratio and thus enhancing displaying performance.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A pixel structure, comprising: a plurality of sub pixel units each comprising a pixel electrode, a plurality of data lines respectively supplying data signals to the sub pixel units, and a black matrix arranged to correspond to the data lines and the sub pixel units, the plurality of sub pixel units being arranged in multiple columns, of which two adjacent columns of the sub pixel units are sequentially grouped and defined as a sub-pixel-unit-column pair, each of the sub-pixel-unit-column pairs showing mirror symmetry, the data lines being respectively arranged in the sub-pixel-unit-column pairs, the black matrix comprising first portions located above the data lines, second portions each located between two adjacent ones of the first portions, and third portions respectively and perpendicularly connected to opposite ends of the first portions and the second portions, the first portions having a width that is greater than a width of the second portions;

wherein the second portion of the black matrix is located between two adjacent ones of the sub-pixel-unit-column pairs and has opposite edges respectively corresponding to the two pixel-unit-column pairs and each in exact alignment with an edge of the pixel electrode of one of the sub pixel units of each of the two pixel-unit-column pairs that is adjacent to the second portion of the black matrix.

2. The pixel structure as claimed in claim 1, wherein two adjacent ones of the sub-pixel-unit-column pairs comprise sub pixel units that are located on a same row and include a first sub pixel unit, a second sub pixel unit, a third sub pixel unit, and a fourth sub pixel unit that are sequentially adjacent to each other, in which the data lines include a first data line that supplies a data signal to the first sub pixel unit, a second data line that supplies a data signal to the second sub pixel unit, a third data line that supplies a data signal to the third sub pixel unit, and a fourth data line that supplies a the data signal to the fourth sub pixel unit, and the first data line is arranged by the side of the first sub pixel unit that is close to the second sub pixel unit; the second data line is arranged by the side of the second sub pixel unit that is close to the first sub pixel unit; the third data line is arranged by the side of the third sub pixel unit that is distant from the second sub pixel unit; and the fourth data is arranged by the side of the fourth sub pixel unit that is close to the third sub pixel unit.

3. The pixel structure as claimed in claim 2, wherein the first portion of the black matrix is located above the first and second sub pixel units and partly covers the first and second sub pixel units and the second portion is located above the space between the second and third sub pixel units and has a width that is equal to a spacing distance between the second sub pixel unit and the third sub pixel unit.

4. The pixel structure as claimed in claim 3, wherein a width of a portion of the first portion that covers the first sub pixel unit is identical to a width of a portion thereof covering the second sub pixel unit.

5. The pixel structure as claimed in claim 4, wherein the width of the portion of the first portion that covers the first sub pixel unit and the width of the portion of the first portion that covers the second sub pixel unit are both 2 µm-20 µm.

6. A pixel structure, comprising: a plurality of sub pixel units each comprising a pixel electrode, a plurality of data lines respectively supplying data signals to the sub pixel units, and a black matrix arranged to correspond to the data lines and the sub pixel units, the plurality of sub pixel units being arranged in multiple columns, of which two adjacent columns of the sub pixel units are sequentially grouped and defined as a sub-pixel-unit-column pair, each of the sub-pixel-unit-column pairs showing mirror symmetry, the data lines being respectively arranged in the sub-pixel-unit-column pairs, the black matrix comprising first portions located above the data lines, second portions each located between two adjacent ones of the first portions, and third portions respectively and perpendicularly connected to opposite ends of the first portions and the second portions, the first portions having a width that is greater than a width of the second portions;
wherein two adjacent ones of the sub-pixel-unit-column pairs comprise sub pixel units that are located on a same row and include a first sub pixel unit, a second sub pixel unit, a third sub pixel unit, and a fourth sub pixel unit that are sequentially adjacent to each other, in which the data lines include a first data line that supplies a data signal to the first sub pixel unit, a second data line that supplies a data signal to the second sub pixel unit, a third data line that supplies a data signal to the third sub pixel unit, and a fourth data line that supplies a the data signal to the fourth sub pixel unit, and the first data line is arranged by the side of the first sub pixel unit that is close to the second sub pixel unit; the second data line is arranged by the side of the second sub pixel unit that is close to the first sub pixel unit; the third data line is arranged by the side of the third sub pixel unit that is distant from the second sub pixel unit; and the fourth data is arranged by the side of the fourth sub pixel unit that is close to the third sub pixel unit; and
wherein the second portion of the black matrix is located above the space between the second and third sub pixel units and opposite edges of the second portion are respectively in exact alignment to edges of the pixel electrodes of the second sub pixel unit and the third sub pixel unit that are adjacent to each other.

7. The pixel structure as claimed in claim 6, wherein the first portion of the black matrix is located above the first and second sub pixel units and partly covers the first and second sub pixel units and the second portion has a width that is equal to a spacing distance between the second sub pixel unit and the third sub pixel unit.

8. The pixel structure as claimed in claim 6, wherein a width of a portion of the first portion that covers the first sub pixel unit is identical to a width of a portion thereof covering the second sub pixel unit.

9. The pixel structure as claimed in claim 8, wherein the width of the portion of the first portion that covers the first sub pixel unit and the width of the portion of the first portion that covers the second sub pixel unit are both 2 µm-20 µm.

10. A liquid crystal panel, comprising a TFT (Thin-Film Transistor) substrate, a CF (Color Filter) substrate opposite to and laminated to the TFT substrate, and a liquid crystal layer arranged between the TFT substrate and the CF substrate, the TFT substrate comprising a plurality of sub pixel units each comprising a pixel electrode and a plurality of data lines respectively supplying data signals to the sub pixel units formed thereon, the CF substrate comprising a black matrix formed thereon to correspond to the data lines and the sub pixel units, the plurality of sub pixel units being arranged in multiple columns, of which two adjacent columns of the sub pixel units are sequentially grouped and defined as a sub-pixel-unit-column pair, each of the sub-pixel-unit-column pairs showing mirror symmetry, the data lines being respectively arranged in the sub-pixel-unit-column pairs, the black matrix comprising first portions located above the data lines, second portions each located between two adjacent ones of the first portions, and third portions respectively and perpendicularly connected to opposite ends of the first portions and the second portions, the first portions having a width that is greater than a width of the second portions;
wherein the second portion of the black matrix is located between two adjacent ones of the sub-pixel-unit-column pairs and has opposite edges respectively corresponding to the two pixel-unit-column pairs and each in exact alignment with an edge of the pixel electrode of one of the sub pixel units of each of the two pixel-unit-column pairs that is adjacent to the second portion of the black matrix.

11. The liquid crystal panel as claimed in claim 10, wherein two adjacent ones of the sub-pixel-unit-column pairs comprise sub pixel units that are located on a same row and include a first sub pixel unit, a second sub pixel unit, a third sub pixel unit, and a fourth sub pixel unit that are sequentially adjacent to each other, in which the data lines include a first data line that supplies a data signal to the first sub pixel unit, a second data line that supplies a data signal to the second sub pixel unit, a third data line that supplies a data signal to the third sub pixel unit, and a fourth data line that supplies a the data signal to the fourth sub pixel unit, and the first data line is arranged by the side of the first sub pixel unit that is close to the second sub pixel unit; the second data line is arranged by the side of the second sub pixel unit that is close to the first sub pixel unit; the third data line is arranged by the side of the third sub pixel unit that is distant from the second sub pixel unit; and the fourth data is arranged by the side of the fourth sub pixel unit that is close to the third sub pixel unit.

12. The liquid crystal panel as claimed in claim 11, wherein the first portion of the black matrix is located above the first and second sub pixel units and partly covers the first and second sub pixel units and the second portion is located above the space between the second and third sub pixel units and has a width that is equal to a spacing distance between the second sub pixel unit and the third sub pixel unit.

13. The liquid crystal panel as claimed in claim 12, wherein a width of a portion of the first portion that covers the first sub pixel unit is identical to a width of a portion thereof covering the second sub pixel unit.

14. The liquid crystal panel as claimed in claim 13, wherein the width of the portion of the first portion that covers the first sub pixel unit and the width of the portion of the first portion that covers the second sub pixel unit are both 2 µm-20 µm.

\* \* \* \* \*